(12) United States Patent  
Lebby et al.

(10) Patent No.: US 7,355,269 B1
(45) Date of Patent: Apr. 8, 2008

(54) IC ON NON-SEMICONDUCTOR SUBSTRATE

(76) Inventors: Michael Lebby, 30 N. La Barge Rd., Apache Junction, AZ (US) 85219; Vijit Sabnis, 2240 Homestead Ct., Apt. 116, Los Altos, CA (US) 94024; Petar B. Atanackovic, 1050 Waverley St., Palo Alto, CA (US) 94301

( * ) Notice: Subject to any disclaimer, the term of this patent is extended or adjusted under 35 U.S.C. 154(b) by 155 days.

(21) Appl. No.: 11/398,910

(22) Filed: Apr. 6, 2006

(51) Int. Cl.
*H01L 23/58* (2006.01)

(52) U.S. Cl. .............. 257/644; 257/347; 257/E27.111; 438/479; 438/764

(58) Field of Classification Search ............. 257/644, 257/E27.111
See application file for complete search history.

(56) References Cited

U.S. PATENT DOCUMENTS 6,734,453 B2 * 5/2004 Atanackovic et al. ......... 257/19
6,852,575 B2 * 2/2005 Bojarczuk, Jr. et al. ..... 438/149

* cited by examiner

*Primary Examiner*—Tu-Tu Ho
(74) *Attorney, Agent, or Firm*—Parsons & Goltry; Robert A. Parsons; Michael W. Goltry

(57) ABSTRACT

An integrated circuit and method of fabrication including a non-semiconductor material substrate with a layer of single crystal rare earth deposited on the surface thereof. A layer of single crystal semiconductor material is grown on the layer of single crystal rare earth and an integrated circuit is formed in the layer of single crystal semiconductor material. In a preferred embodiment the single crystal semiconductor material is silicon and the integrated circuit is formed by standard semiconductor industry processes.

10 Claims, 1 Drawing Sheet

IC ON NON-SEMICONDUCTOR SUBSTRATE

FIELD OF THE INVENTION

This invention relates in general to integrated circuits, and more particularly to integrated circuits fabricated on non-semiconductor substrates.

BACKGROUND OF THE INVENTION

Semiconductor components and integrated circuits are fabricated on semiconductor substrates, for example single crystal silicon. Single crystal silicon is primarily used because it is the least expensive and is easier to work with than many compound elements. Because of this, the semiconductor industry is directed primarily to silicon and the major portion of all semiconductor components and integrated circuits are silicon based.

One major problem with the use of silicon wafers and/or chips as substrates is the amount of effort and waste that must go into growing silicon ingots, cutting the ingots into wafers, and machining the wafers to a desired thickness with at least one very smooth surface. Further, once integrated circuits are fabricated on a wafer and the wafer is cut into die, the die are difficult to mount and connect to external circuitry. Also, the size of the die is limited.

It would be highly advantageous, therefore, to remedy the foregoing and other deficiencies inherent in the prior art.

Accordingly, it is an object of the present invention to provide new and improved integrated circuits fabricated on non-semiconductor substrates.

Another object of the invention is to provide a new and improved method of fabricating integrated circuits on non-semiconductor substrates.

SUMMARY OF THE INVENTION

Briefly, to achieve the desired objects of the instant invention in accordance with a preferred embodiment thereof, provided is an integrated circuit and method of fabrication. The integrated circuit includes a non-semiconductor material substrate with a layer of single crystal rare earth deposited on the surface thereof. A layer of single crystal semiconductor material is grown on the layer of single crystal rare earth and an integrated circuit is formed in the layer of single crystal semiconductor material.

In a preferred embodiment the single crystal semiconductor material is silicon and the integrated circuit is formed by standard semiconductor industry processes. To lattice match the silicon with the rare earth, the layer of single crystal rare earth preferably includes either Erbium (Er) or Ytterbium (Yb). As will be understood by those skilled in the art, silicon is preferred for the semiconductor material because the processing of silicon is the most advanced in the semiconductor field. However, substantially any semiconductor material can be used and any rare earth that can be deposited in a single crystal layer and that is substantially lattice matched to a desired semiconductor material can be used.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the drawings, in which.

DETAILED DESCRIPTION OF THE DRAWINGS

Figure 1:
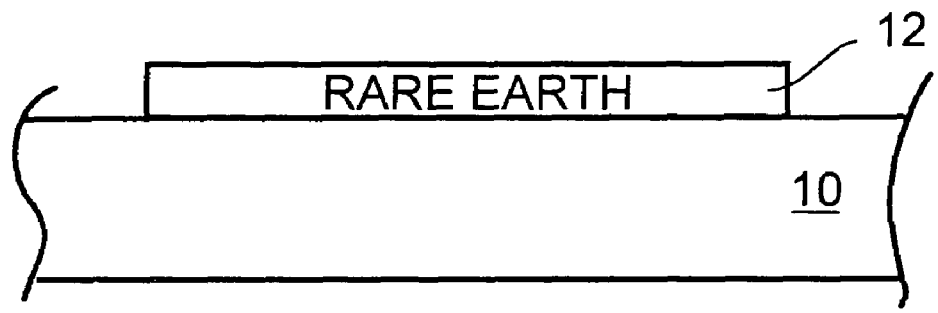
FIG. 1 is a simplified sectional view of a first step in a process of fabricating integrated circuits on a non-semiconductor substrate in accordance with the present invention.

Turning now to FIG. 1, a simplified sectional view of a first step in the fabrication of integrated circuits (ICs) on a non-semiconductor substrate 10 is illustrated. Non-semiconductor substrate 10 can be any rigid material on which it is desired to place ICs, such as glass, ceramic, or the like and which preferably has a substantially similar temperature coefficient of expansion. Further, the term "integrated circuit" (IC) is herein intended to include discrete devices (e.g. semiconductor lasers, light emitting devices (LEDs), photodetectors, transistors, etc.) and their connections, multiple devices in circuit, and combinations thereof.

Non-semiconductor substrate 10, which in this example is glass for simplicity of description, has a layer 12 of single crystal rare earth (RE) deposited thereon. While any of the materials known as 'rare earths' can be used, two preferred examples are Erbium (Er) and Ytterbium (Yb). Other typical examples of rare earth materials that can be used in this application are described in a copending United States patent application entitled "Rare Earth-Oxides, Rare Earth-Nitrides, Rare Earth-Phosphides and Ternary Alloys With Silicon", filed on Dec. 28, 2004, and bearing serial number, which is a conversion of U.S. provisional application No. 60/533,378, filed 29 Dec. 2003 and bearing the same title, incorporated herein by reference. It should be noted that in at least some instances layer 12 can include single crystal rare earth insulating material (e.g. rare earth oxide, rare earth nitride, rare earth oxynitride, etc.) grown directly on the surface of substrate 10. Thus, the term "rare earth" as used in conjunction with layer 12 is intended to encompass any rare earth material.

The rare earth material or materials forming layer 12 typically consist of single component rare earth elements or mixtures of rare earth elements bonded with oxygen, nitrogen, phosphorous, or arsenic or mixtures of these components (see the U.S. patent application cited above). The exact choice of elemental mixtures is chosen to match a particular crystal lattice constant approximately corresponding to a subsequently deposited semiconductor layer (described below) and to control the conductivity of the rare earth material from metallic to semiconducting to insulating, as desired by the end application.

The preferred embodiment for deposition of single crystal rare earths is ultra-high vacuum atomic layer epitaxy (ALE). In this embodiment, the rare earth elements are evaporated from standard effusion or Knudsen cells at temperatures st, above, or below the melting temperature of the solid rare earth element. The other components of the rare earth material can be deposited using standard effusion cells or introduced through standard gas injection and/or plasma injection methods. The deposition chamber typically has a base pressure of $10^{-10}$ to $10^{-11}$ torr, while the pressure during deposition can reach as high as $10^{-5}$ torr. The substrate during deposition is typically maintained at an elevated temperature and rotates about its central axis to improve uniformity. Other techniques, well known to those skilled in the art, such as molecular beam epitaxy, reduced— and atmospheric—pressure chemical vapor deposition, metal-organic CVD, pulsed laser deposition, and physical vapor deposition can be used to deposit rare earth materials as well.

In the preferred embodiment, typical substrate temperatures vary between approximately 200° C. and 800° C. and depend on the starting substrate material. Also, for the preferred embodiment using ALE, the base pressure is typically between $10^{-11}$ and $10^{-10}$ torr, while the deposition temperature can range from $10^{-10}$ to $10^{-15}$ torr. Further, thickness of the rare earth single crystal layer generally lies within a range of 2 Å to 5 Å for one monolayer deposition and can extend up to 1 μm for thick layers.

Figure 2:
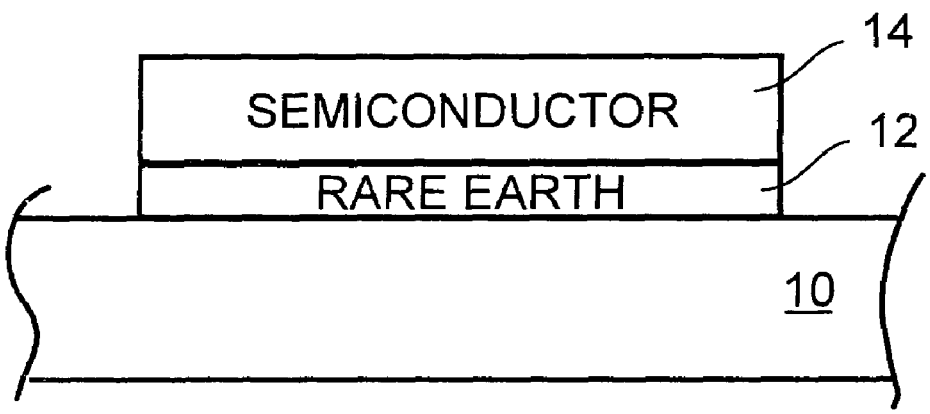
FIG. 2 is a simplified sectional view of a second step in the process of fabricating integrated circuits on a non-semiconductor substrate.

Referring additionally to FIG. 2, a second step in the process is illustrated in which a layer 14 of single crystal semiconductor material is grown on the surface of RE layer 12. As will be understood by those skilled in the art, it is desirable to select a rare earth for layer 12 that substantially lattice matches semiconductor material layer 14 with RE layer 12 at the junction. By selecting a RE material that is substantially lattice matched with semiconductor layer 14, semiconductor layer 14 can be grown as a single crystal layer. Some difference in the lattice matching can be tolerated to provide either compressive strain or tensile strain without producing dislocations, defects, or fractures in the final structure.

Also, in some applications it may be feasible to incorporate one or more lattice matching layers of materials between rare earth for layer 12 and the desired semiconductor layer 14. In this fashion a gradient of lattice matching materials gradually matches a desired semiconductor layer to a selected rare earth layer. Any embodiment, either one in which semiconductor layer 14 is formed directly on rare earth layer 12 or one in which a gradient is formed therebetween, as long as the final structure is without dislocations, defects, or fractures, is considered, for purposes of this disclosure to be substantially lattice matched.

Because silicon processing is so well developed in the semiconductor industry, semiconductor layer 14 will generally be formed of single crystal silicon. Rare earth materials that can conveniently be lattice matched with single crystal silicon include, for example, Erbium (Er) and Ytterbium (Yb). Silicon is usually selected so that integrated circuits, such as CMOS circuits and the like can be easily integrated thereon. Also, arrays of VCSELs (vertical cavity surface emitting lasers), LEDs and the like, generally formed in silicon, can be formed for the fabrication of displays and the like.

Figure 3:
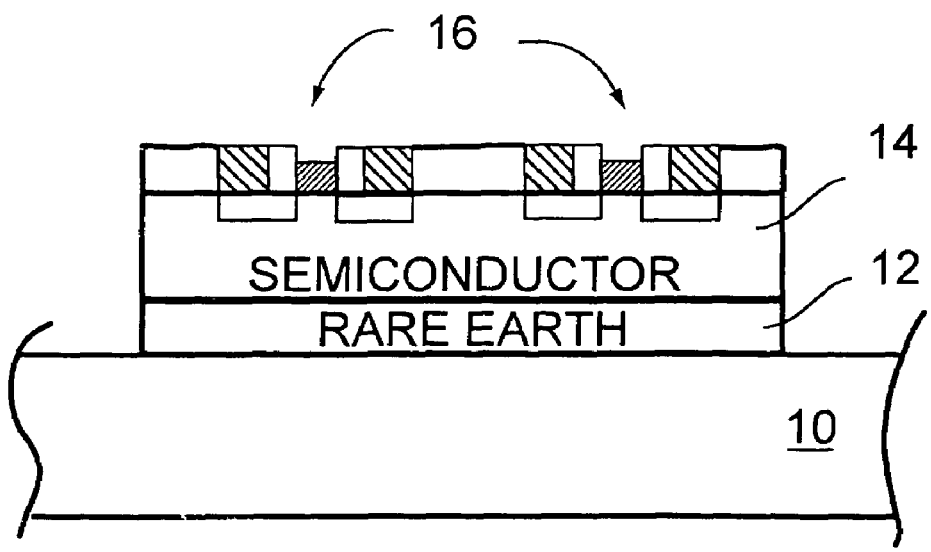
FIG. 3 is a simplified sectional view of additional steps in the process of fabricating integrated circuits on a non-semiconductor substrate.

Once single crystal semiconductor layer 14 is grown, it can be treated similar to a single crystal semiconductor substrate. Referring to FIG. 3 for example, one or more field effect transistors 16 (FETs) are formed in layer 14 using well known semiconductor processing techniques. Further, more than one semiconductor layer 14 can be grown on layer 12 or additional individual rare earth layers can be grown on substrate 10 and single crystal semiconductor layers grown on the additional rare earth layers. The various ICs fabricated on substrate 10 can be interconnected, if desired, by filling areas between ICs with an insulating material, such as spun glass, silicon dioxide, etc., and forming metallic interconnects (generally referred to in the semiconductor industry as metallization) therebetween.

Thus, new and improved integrated circuits and methods of fabricating integrated circuits on non-semiconductor substrates are provided. Layers of semiconductor material, such as silicon, can be grown and used in semiconductor processes as substrates without the need to grow, cut, and process, ingots and wafers of silicon. Further, the new and improved integrated circuits are manufacturable using common well known semiconductor manufacturing techniques and standard semiconductor manufacturing processes, once the single crystal rare earth layer is deposited on a selected non-semiconductor substrate.

Various changes and modifications to the embodiments herein chosen for purposes of illustration will readily occur to those skilled in the art. To the extent that such modifications and variations do not depart from the spirit of the invention, they are intended to be included within the scope thereof which is assessed only by a fair interpretation of the following claims.

Having fully described the invention in such clear and concise terms as to enable those skilled in the art to understand and practice the same, the invention claimed is:

1. An integrated circuit comprising:
   a non-semiconductor material substrate having a surface;
   a layer of single crystal rare earth deposited on the surface of the non-semiconductor material substrate;
   a layer of single crystal semiconductor material grown on the layer of single crystal rare earth; and
   an integrated circuit formed in the layer of single crystal semiconductor material.

2. An integrated circuit as claimed in claim 1 wherein the non-semiconductor material substrate includes one of glass and ceramic.

3. An integrated circuit as claimed in claim 1 wherein the layer of single crystal semiconductor material includes silicon.

4. An integrated circuit as claimed in claim 3 wherein the layer of single crystal rare earth includes one of Erbium (Er) and Ytterbium (Yb).

5. An integrated circuit as claimed in claim 1 wherein the layer of single crystal rare earth and the layer of single crystal semiconductor material are substantially lattice matched.

6. A method of fabricating an integrated circuit on a non-semiconductor substrate comprising the steps of:
   providing a non-semiconductor material substrate having a surface;
   depositing a layer of single crystal rare earth on the surface of the non-semiconductor material substrate;
   growing a layer of single crystal semiconductor material on the layer of single crystal rare earth; and
   forming an integrated circuit in the layer of single crystal semiconductor material.

7. A method as claimed in claim 6 wherein the step of providing a non-semiconductor material substrate includes providing a substrate of one of glass and ceramic.

8. A method as claimed in claim 6 wherein the step of growing a layer of single crystal semiconductor material includes growing a layer of single crystal silicon.

9. A Method as claimed in claim 8 wherein the step of depositing a layer of single crystal rare earth includes depositing a layer of one of Erbium (Er) and Ytterbium (Yb).

10. A method as claimed in claim 6 wherein the step of growing the layer of single crystal semiconductor material on the layer of single crystal rare earth includes substantially lattice matching the single crystal semiconductor material to the layer of single crystal rare earth.

\* \* \* \* \*